United States Patent [19]

Miura

[11] Patent Number: 4,954,874

[45] Date of Patent: Sep. 4, 1990

[54] PACKAGE SEMICONDUCTOR DEVICE USING CHALCOGENIDE GLASS SEALING

[75] Inventor: Yasuaki Miura, Tokyo, Japan

[73] Assignee: Tokyo Shibaura Denki Kabushiki Kaisha, Kawasaki, Japan

[21] Appl. No.: 529,936

[22] Filed: Sep. 8, 1983

Related U.S. Application Data

[63] Continuation of Ser. No. 212,452, Dec. 3, 1980, abandoned.

[30] Foreign Application Priority Data

Dec. 12, 1979 [JP] Japan .................. 54-160245

[51] Int. Cl.⁵ ............. H01L 45/00; H01L 23/30; H01L 23/02; H01L 39/02
[52] U.S. Cl. ............................ 357/74; 375/2; 375/73; 375/80
[58] Field of Search ............. 357/2, 73, 74, 80; 501/40

[56] References Cited

U.S. PATENT DOCUMENTS

| | | | |
|---|---|---|---|
| 3,024,119 | 3/1962 | Flaschen | 357/73 |
| 3,248,350 | 4/1966 | Triggle | 526/271 |
| 3,354,316 | 11/1967 | Deverall | 357/73 |
| 3,360,649 | 12/1967 | Brau et al. | 357/73 |
| 3,413,187 | 11/1968 | Krause et al. | 357/73 |
| 3,650,778 | 3/1972 | Dumesnil et al. | 357/73 |
| 3,697,666 | 10/1972 | Wakley et al. | 357/80 |
| 3,820,968 | 6/1974 | Haisty | 357/2 |
| 3,920,461 | 11/1975 | Asahara et al. | 357/2 |
| 3,983,076 | 9/1976 | Rockstad et al. | 357/73 |
| 4,015,282 | 3/1977 | Shaw | 357/2 |
| 4,142,203 | 2/1979 | Dietz | 357/73 |
| 4,167,806 | 9/1979 | Kumurdjian | 357/2 |

FOREIGN PATENT DOCUMENTS

| | | |
|---|---|---|
| 630232 | 10/1978 | U.S.S.R. ............... 501/40 |
| 913791 | 12/1962 | United Kingdom . |
| 923338 | 4/1963 | United Kingdom . |
| 942755 | 11/1963 | United Kingdom . |

OTHER PUBLICATIONS

A. R. Hilton et al, "Non-Oxide IVA-VAI Chalcogenide Glasses, Part I, Glass-Forming Regions and Variations in Physical Properties", *Physics and Chemistry of Glasses*, vol. 7 (1966), pp. 105-112.

A. R. Hilton et al, "Non-Oxide IVA-VA-VIA Chalcogenide Glasses, Part 2, Infra-Red Absorption by Oxide Impurities", *Physics and Chemistry of Glasses*, vol. 7 (1966), pp. 112-116.

A. R. Hilton et al, "Non-Oxide IVA-VA-VIA Chalcogenide Glasses, Part 3, Structural Studies", *Physics and Chemistry of Glasses*, vol. 7 (1966), pp. 116-126.

H. Rawson, "Inorganic Glass-Forming Systems," Chapter 16, Chalcogenide Glasses, pp. 249-286 (1967).

Primary Examiner—J. Carroll
Attorney, Agent, or Firm—Finnegan, Henderson, Farabow, Garrett, and Dunner

[57] ABSTRACT

A semiconductor device includes a package hermetically sealed with a chalcogenide-based glass sealing agent. A semiconductor element is housed within the package, and the respective electrodes of the semiconductor element are connected through bonding wires to leads extending to the outside of the package.

6 Claims, 2 Drawing Sheets

PACKAGE SEMICONDUCTOR DEVICE USING CHALCOGENIDE GLASS SEALING

This is a continuation of Ser. No. 212,452, filed 12/3/80, now abandoned.

The present invention relates to a packaged semiconductor device and, more particularly, to a semiconductor device hermetically sealed in a package.

Semiconductor elements are packaged to be placed under usable condition as well as to be protected from mechanical shocks and the external environment (humidity, contamination, temperature and the like) so as to improve the reliability. As one of the packaging techniques, it has been proposed to mount a semiconductor chip or pellet on which a predetermined circuit is formed to a base body of a package, to connect the electrodes of the semiconductor elements with the leads of the package and then to hermetically bond a lid body to the base body of the package with a bonding agent. As such a bonding agent, an oxide glass is known which contains lead oxide, boron trioxide and the like as main components, and further includes silicon oxide, titanium oxide, zirconium oxide, aluminum oxide and the like.

When such an oxide glass is used as a bonding agent, bonding must be performed at a temperature higher than the glass transition point but lower than the melting point of the oxide glass. However, the glass transition point of the oxide glass is relatively high (for example, there is one with a glass transition point of over 300° C.). This results in a considerably complicated sealing operation and damage to the semiconductor characteristics due to heat. Further, since bonding must be performed in an oxidizing atmosphere so as not to change the oxides constituting the glass, bonding wires tend to be degraded. With a conventional semiconductor device sealed with an oxide glass, a small electrical leak tends to be generated between the leads of the package, presenting problems in reliability.

It is, therefore, the primary object of the present invention to provide a packaged semiconductor device which may be fabricated in a relatively simple manner and which has high reliability.

A packaged semiconductor device of the present invention comprises:

a base body of a package;
a semiconductor element mounted on said base body;
a lid body of said package for sealing said semiconductor element;
a layer of a bonding agent hermetically sealing said base body and said lid body, said bonding agent including a glass of a chalcogenide of at least one element selected from the group consisting of IVA and VA group elements; and
leads, each having one end connected to electrodes of said semiconductor element and the other end extending outside said package.

This invention can be more fully understood from the following detailed description when taken in conjunction with the accompanying drawings, in which.

The present invention will now be described in more detail with reference to the accompanying drawings.

Figure 1:
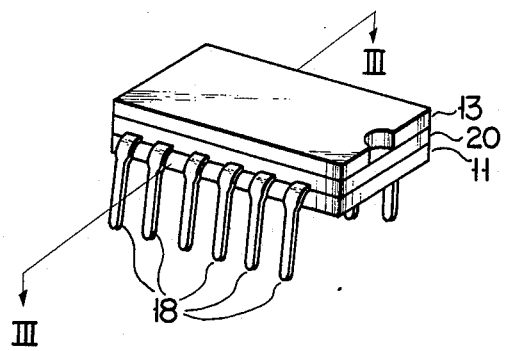
FIG. 1 is a perspective view of a CIRDIP type packaged semiconductor device according to the present invention.
Figure 2:
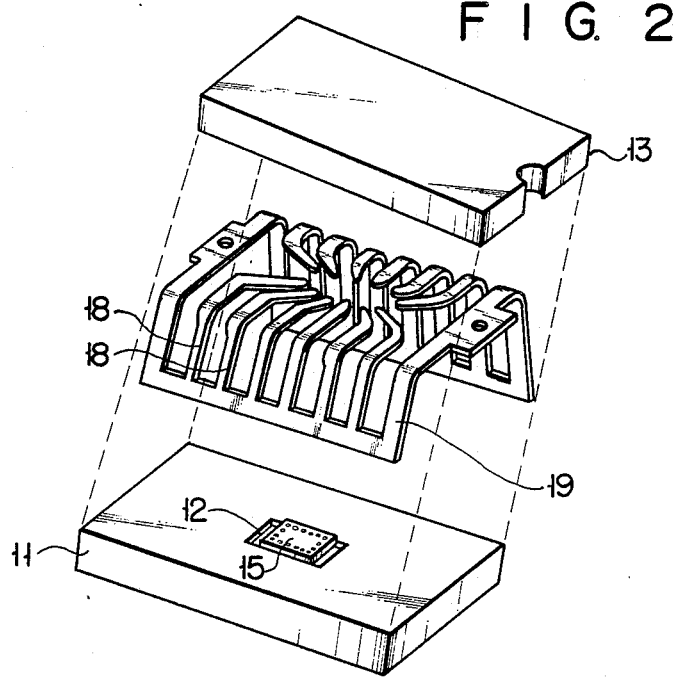
FIG. 2 is an exploded perspective view before assembly of respective components of the semiconductor device shown in FIG. 1.
Figure 3:
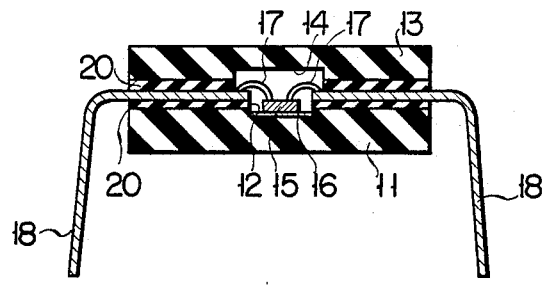
FIG. 3 is a sectional view along the line III—III of FIG. 1.

FIGS. 1 to 3 show a case where the present invention is applied to a semiconductor device sealed in a CIRDIP type package. The same reference numerals designate the same parts in these FIGS. This semiconductor device has a package consisting of a ceramic base body 11 and a ceramic lid body 13. As shown in FIG. 2 and particularly in FIG. 3, a recess 12 is formed at the center of the base body. A semiconductor element 15 with a predetermined circuit formed thereon is mounted inside this recess 12 with a bonding material 16 (FIG. 3) by a general bonding method such as soldering or resin bonding and in particular, by eutectic bonding.

The lid body 13 has a recess 14 at the center for defining a space with the recess 12 of the base body 11 for housing the semiconductor element 15.

Respective electrodes of the semiconductor element 15 are connected to respective one ends of external leads 18 with bonding wires 17 as shown in FIG. 3. The front ends of the external leads 18 protrude inside the space and contact the wires 17. The external leads 18 extend parallel to each other between the base body 11 and the lid body 13, and bend downward outside the base and lid bodies. These leads 18 are assembled with a frame 19 (FIG. 2), which supports them and is formed integrally therewith. The frame 19 is cut away after assembly.

In a semiconductor device of such a construction, the base body 11 and the lid body 13 are hermetically sealed with bonding agent layers 20. These bonding agent layers 20 fix the leads 18. According to the present invention, the bonding agent is a glass of a chalcogenide (i.e., sulfide, selenide, and/or telluride) of at least one element selected from the group consisting of IVA group elements (for example, silicon and germanium) and VA group elements (for example, arsenic). Such chalcogenide glass is described in A. R. Hilton et al, Physics and Chemistry of Glasses-, Vol. 7 [4]pp. 105–126, 1966 under the item "Non-oxide IVA-VA-VIA chalcogenide glasses". The chalcogenide glass is also described in H. Rawson, Inorganic Glass-Forming Systems pp. 249 –286, Academic Press, 1967 under the item "Chalcogenide Glasses".

Figure 4:
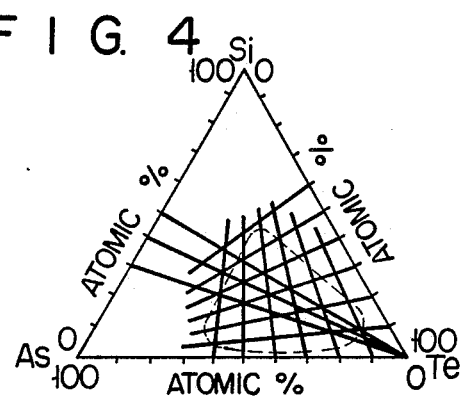
FIG. 4 is a phase equilibrium diagram showing the composition of the bonding agent used in the present invention along triangular coordinates.

Examples of such a chalcogenide glass are As-Se, As-S, Si-As-Te, AsS-AsSe, Si-As-Se, and Ge-As-Se. It is of course to be understood that each component is contained in a ratio suffucient to provide a glass. As an example, the glass region for the Si-As-Te system is shown in a phase equilibrium diagram plotted along triangular coordinates in FIG. 4. The area surrounded by the broken lines in FIG. 4 is the glassification region. The particularly preferable glasses for the purpose of the present invention are Si (10 to 20 atomic %) - As (30 to 50 atomic %) - Se or Te (remainder) glass, and Ge (10 to 15 atomic %) - As (30 to 50 atomic %) - Se or Te (remainder) glass Oxide glass components (e.g., $As_2O_3$) may be added to such a chalcogenide glass in an amount of 0 mol % to 20 mol% based on the chalcogenide glass.

For forming a semiconductor device using such a chalcogenide glass bonding agent, the semiconductor element 15 is mounted to the base body 11, and the respective electrodes and the leads 18 are connected. Then, a mixture of a chalcogenide glass powder and a binder is applied to the surface of the base body 11 except for the recess 12, and to the surface of the lid body 13 except for the recess 14. The layers of the mixture are superposed and kept at a temperature higher than the softening point but lower than the melting point of the glass for 5 to 15 minutes. The layers are gradually cooled thereafter. A semiconductor device 5 as shown in FIGS. 1 and 3 is thus obtained. These chalcogenide glasses may be sealed at temperatures lower than 300° C. in most cases, so that the semiconductor element may not be adversely affected. Further, since the sealing may be performed in a non-oxidizing atmosphere (e.g., $N_2$), the electrical characteristics of the semiconductor element and the bonding wires may not be degraded. Furthermore, with a semiconductor device thus obtained, it has been confirmed that no electrical leaks occur and no problem of capacity (problem of soft error) by alpha-ray is caused with a D-RAM (dynamic random access memory).

Figure 5:
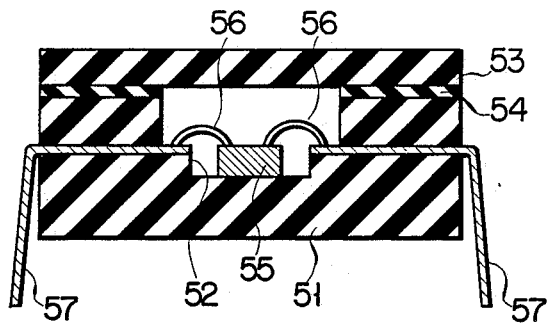
FIG. 5 is a sectional view of a frit seal type semiconductor device.

The present invention is also applicable to a frit seal type semiconductor device as shown in FIG. 5. Referring to the Fig., a base body 51 having a recess 52 is hermetically sealed with a lid body 53 using a chalcogenide glass 54. A semiconductor element 55 is mounted in the recess 52 of the base body 51, and its electrodes are connected to leads 57 with bonding wires 56. The leads 57 extend through and outside the base body 51.

What is claimed is:

1. A packaged semiconductor device comprising: a ceramic base body of a package;
   a semiconductor element mounted on said ceramic base body;
   a ceramic lid body of said package for sealing said semiconductor element;
   a layer of a bonding agent hermetically sealing said ceramic base body and said ceramic lid body, said bonding agent consisting of a chalcogenide glass selected from the group consisting of Si-As-Te, Si-As-Se, Ge-As-Se and Ge-As-Te glasses, said chalcogenide glass including oxide glass components in an amount of 1 mol percentage to 20 mol percentage and having been heated up to, but not above, 300° C.; and
   leads, each having one end connected to electrodes of said semiconductor element and the other end extending outside said package.

2. A device as claimed in claim 1, wherein the chalcogenide glass consists of 10 to 20 atomic % of Si and 30 to 50 atomic % of As, with the remainder being Se or Te.

3. A device as claimed in claim 1, wherein the chalcogenide glass consists of 10 to 15 atomic % of Ge and 30 to 50 atomic % of As, with the remainder being Se or Te.

4. A device as claimed in any one of claims 1 to 3, wherein the leads extend to the outside through the layer of the bonding agent.

5. A device as claimed in any one of claims 1 to 3, wherein the leads extend to the outside through the base body.

6. The device as claimed in claim 1 wherein the leads are connected to the electrodes through bonding wires.

* * * * *